United States Patent
Huang et al.

(10) Patent No.: US 6,395,586 B1
(45) Date of Patent: May 28, 2002

(54) METHOD FOR FABRICATING HIGH APERTURE RATIO TFT'S AND DEVICES FORMED

(75) Inventors: Ting-Hui Huang; Jr-Hong Chen, both of Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 09/243,593

(22) Filed: Feb. 3, 1999

(51) Int. Cl.[7] ............................................. H01L 21/00
(52) U.S. Cl. ....................... 438/149; 438/30; 438/158; 257/59; 257/72
(58) Field of Search ................. 438/153, 158, 438/30, 149, 159; 257/82, 232, 59, 72

(56) References Cited

U.S. PATENT DOCUMENTS

| | | | |
|---|---|---|---|
| 5,075,674 A | * 12/1991 | Katayama et al. | 345/206 |
| 5,153,754 A | * 10/1992 | Whetten | 257/59 |
| 5,198,685 A | * 3/1993 | Kitani et al. | 257/82 |
| 5,362,660 A | * 11/1994 | Kwasnick et al. | 438/158 |
| 5,471,330 A | * 11/1995 | Sarma | 349/43 |
| 5,478,766 A | * 12/1995 | Park et al. | 438/158 |
| 5,650,358 A | * 7/1997 | Gu et al. | 438/30 |
| 5,770,871 A | * 6/1998 | Weisfield | 257/232 |
| 5,811,318 A | * 9/1998 | Kweon | 438/30 |
| 5,872,370 A | * 2/1999 | Gu et al. | 257/59 |
| 5,917,199 A | * 6/1999 | Byun et al. | 257/213 |
| 5,943,559 A | * 8/1999 | Maeda | 438/149 |
| 5,998,229 A | * 12/1999 | Lyu et al. | 438/30 |
| 6,011,274 A | * 1/2000 | Gu et al. | 257/258 |
| 6,022,753 A | * 2/2000 | Park et al. | 438/30 |
| 6,038,003 A | * 3/2000 | Kim | 349/122 |
| 6,066,506 A | * 5/2000 | Holmberg et al. | 438/4 |
| 6,069,019 A | * 5/2000 | Ishii et al. | 438/30 |

OTHER PUBLICATIONS

LCD R&D Center, LG Electronics Inc., "High–Aperture–Ratio TFT–LCD Using A Low Dielectric Material", Kim et al, pp 5–8, 1997.

\* cited by examiner

Primary Examiner—Eddie Lee
Assistant Examiner—José R. Diaz
(74) Attorney, Agent, or Firm—Randy W. Tung

(57) ABSTRACT

A method for fabricating a high aperture ratio and low contact resistance, TFT structure and devices formed by such method are disclosed. In the method, a source/drain metal layer is deposited directly on a n+ amorphous silicon layer such that the contact resistance of the transistor structure can be significantly reduced. The final deposition of a transparent electrode layer, such as of an ITO material, improves the aperture ratio for the transistor. Numerous other processing benefits are also provided by the present invention novel method such that a more reliable transistor and a capacitor that has more stable storage capacitance can be formed with the transistor. A back channel etched inverted staggered type TFT that has high aperture ratio and low contact resistance is thus provided by the present invention novel method.

19 Claims, 5 Drawing Sheets

METHOD FOR FABRICATING HIGH APERTURE RATIO TFT'S AND DEVICES FORMED

FIELD OF THE INVENTION

The present invention generally relates to a method for fabricating a thin film transistor (TFT) and device formed by such method and more particularly, relates to a method for fabricating a TFT that has high aperture ratio and low contact resistance by depositing a source/drain metal layer directly on a n+ amorphous silicon layer and a transparent electrode layer on top of the TFT structure and device formed by such method.

BACKGROUND OF THE INVENTION

In recent years, large liquid crystal cells have been used in flat panel displays. The liquid crystal cells are normally constructed by two glass plates joined together with a layer of a liquid crystal material sandwiched inbetween. The glass substrates have conductive films coated thereon with at least one of the substrates being transparent. The substrates are connected to a source of power to change the orientation of the liquid crystal material. A possible source of power is a thin film transistor that is used to separately address areas of the liquid crystal cells at very fast rates. The TFT driven liquid crystal cells can be advantageously used in active matrix displays such as for television and computer monitors.

As the requirements for resolution of liquid crystal monitors increase, it becomes desirable to address a large number of separate areas of a liquid crystal cell, called pixels. For instance, in a modem display panel, more than 3,000,000 pixels may be present. At least the same number of transistors must therefore be formed on the glass plates so that each pixel can be separately addressed and left in the switched state while other pixels are addressed.

Thin film transistors are frequently made with either a polysilicon material or an amorphous silicon material. For TFT structures that are made of amorphous silicon material, a common structure is the inverted staggered type which can be back channel etched or tri-layered. The performance of a TFT and its manufacturing yield or throughput depend on the structure of the transistor. For instance, the inverted staggered back channel etched TPT can be fabricated with a number of six masks, whereas other types of inverted staggered TFT require a minimum number of nine masks. The specification for a typical inverted staggered back channel etched TFT includes an amorphous silicon that has a thickness of 3,000 Å, a gate insulator of silicon nitride or silicon oxide, a gate line of Mo/Ta, a signal line of Al/Mo and a storage capacitor. The requirement of a thick amorphous silicon layer in the TFT device is a drawback for achieving a high yield fabrication process since deposition of amorphous silicon is a slow process. A major benefit for the amorphous silicon TFT is its low leakage current which enables a pixel to maintain its voltage. On the other hand, an amorphous silicon TFT has the drawback of a low charge current (or on current) which requires an excessive amount of time for a pixel to be charged to its required voltage.

A second type of TFT is made by using a polysilicon material. Polysilicon is more frequently used for displays that are designed in a smaller size, for instance, up to three inch diagonal for a projection device. At such a small size, it is economical to fabricate the display device on a quartz substrate. Unfortunately, large area display devices cannot be normally made on quartz substrates. The desirable high performance of polysilicon can therefore be realized only if a low temperature process can be developed to enable the use of non-quartz substrates. For instance, in a more recently developed process, large area polysilicon TFT can be manufactured at processing temperatures of less than 600° C. In the process, self-aligned transistors are made by depositing polysilicon and gate oxide followed by source/drain regions which are self-aligned to the gate electrode. The device is then completed with a thick oxide layer, an ITO layer and aluminum contacts.

Polysilicon TFTs have the advantage of a high charge current (or current) and the drawback of a high leakage current. It is difficult to maintain the voltage in a pixel until the next charge in a polysilicon TFT due to its high leakage current. Polysilicon also allows the formation of CMOS devices, which cannot be formed by amorphous silicon. For the fabrication of larger displays, a higher mobility may be achieved by reducing the trap density around the grain boundaries in a hydrogenation process.

Figure 1:
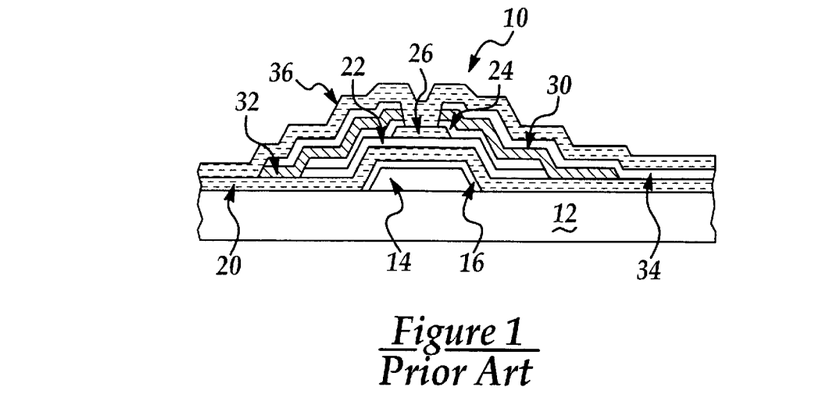
FIG. 1 is an enlarged, cross-sectional view of a conventional tri-layered type inverted staggered TFT.

FIG. 1 shows an enlarged, cross-sectional view of a conventional amorphous silicon TFT structure. Amorphous TFT 10 is built on a low cost glass substrate 12. On top of the glass substrate 12, a gate electrode 14 is first deposited of a refractory metal such as Cr, Ar or Al alloy and then formed. A gate insulating layer 16 is normally formed in an oxidation process. For instance, a high density $TaO_x$ on a Ta gate can be formed to reduce defects such as pin holes and to improve yield. Another gate insulating layer 20 is then deposited of either silicon oxide or silicon nitride. An intrinsic amorphous silicon layer 22 is then deposited with a $n^+$ doped amorphous silicon layer 24 deposited on top to improve its conductivity. Prior to the deposition of the doped amorphous silicon layer 24, an etch stop 26 is first deposited and formed to avoid damages to the amorphous silicon layer 22 in a subsequent etch process for a contact hole. The doped amorphous silicon layer 24 is formed by first depositing the amorphous silicon layer in a chemical vapor deposition process and then implanting ions in an ion implantation process. Boron ions are normally used to achieve $n^+$ polarity. A drain region 30 and a source region 32 are then deposited and formed with a pixel electrode layer 34 of ITO (indium-tin-oxide) material deposited and formed on top. The drain region 30 and the source region 32 are normally deposited of a conductive metal layer. A suitable conductive metal may be a bilayer of Cr/Al. The structure is then passivated with a passivation layer 36.

Figure 2:
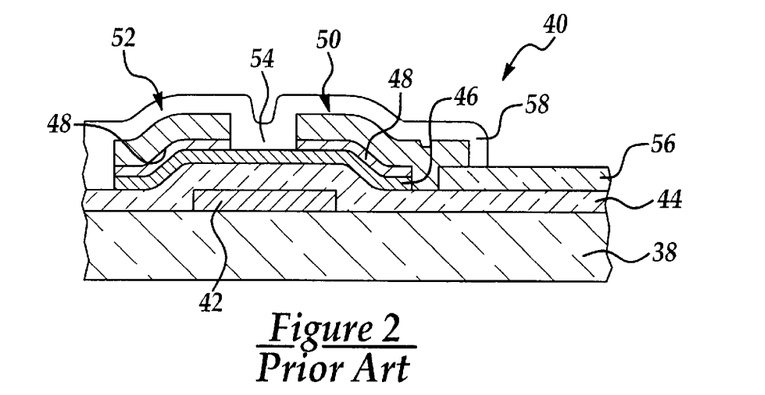
FIG. 2 is an enlarged, cross-sectional view of a back channel etched type inverted staggered TFT.

A second conventional inverted staggered type TFT 40 is shown in FIG. 2. The TFT 40 is frequently called the back channel etched type inverted staggered TFT. A gate electrode 42 is first formed on a non-conducting glass substrate 38. The gate electrode 42 is connected to a gate line (not shown) laid out in the row direction. A dielectric material layer 44 of either silicon oxide or silicon nitride is used to insulate the gate electrode 42. After an amorphous silicon layer 46 and a contact layer 48 are sequentially deposited, patterned and etched, source electrode 50 and drain electrode 52 are formed to provide a channel 54 in-between the two electrodes, hence the name back channel etched TFT. The source electrode 50 of each TFT is connected to a transparent pixel electrode 56 independently formed in the area surrounded by the gate lines and the drain lines (not shown). A transparent passivation layer 58 of a material such as silicon nitride is deposited on the completed structure.

As shown in FIG. 2, the gate electrode 42 is frequently formed of chromium or other similar metals on the transparent glass substrate 38. The dielectric layer 44 of gate oxide or silicon nitride is formed to insulate the upper surface of the glass substrate 38 including the top surface of the gate electrode 42. A semi-conducting layer 46, which may be formed of amorphous silicon is stacked on the dielectric film 44 over the gate electrode 42. The drain electrode 52 and the source electrode 50 are formed on the semi-conducting film 46 and are separated from each other by a predetermined distance forming the channel section 54. The two electrodes each has a contact layer of 48 and a metal layer which are electrically connected to the semi-conducting layer 46. The transparent electrode 44 may be formed of ITO.

In modern TFT devices utilized for driving LCD, it is desirable to have a high aperture ratio and a low contact resistance in the TFT. The aperture ratio of a TFT is defined as the ratio of the transparent area on the black matrix to the unit cell area. The larger the aperture ratio of a TFT, the better the performance due to a higher light intensity obtained. A low contact resistance in a TFT is desirable since that the performance of the transistor can be improved by reducing the driving current. In conventional TFT-LCD devices which require at least 6 masks for its fabrication, it is not possible to obtain the benefits of both a high aperture ratio and a low contact resistance between source/drain metal layer and n+ amorphous silicon (or a-Si) layer. Furthermore, a conventional 6-mask TFT process for making high aperture ratio TFT's does not produce storage capacitors on the device which have satisfactory performance stability.

It is therefore an object of the present invention to provide a high aperture ratio and low contact resistance thin film transistor structure that does not have the drawbacks or shortcomings of the conventional methods.

It is another object of the present invention to provide a method for fabricating a high aperture ratio and low contact resistance TFT structure by depositing directly a source/drain metal layer on a n+ a-Si layer for achieving low contact resistance.

It is a further object of the present invention to provide a method for fabricating a high aperture ratio and low contact resistance TFT structure by depositing a transparent electrode layer on top of the TFT structure and into contact openings such that the high aperture ratio characteristic can be realized.

It is another further object of the present invention to provide a method for fabricating a high aperture ratio and low contact resistance TFT structure by pre-etching a gate nitride layer to at least 20% of its original thickness during an amorphous silicon island formation process by dry etching.

It is still another object of the present invention to provide a method for fabricating a high aperture ratio and low contact resistance TFT structure by directly depositing a source/drain metal layer on a n+ a-Si layer before the patterning of the silicon layer.

It is yet another object of the present invention to provide a method for fabricating a high aperture ratio and low contact resistance TFT structure by depositing an organic polymeric layer on top of the TFT structure for passivation prior to a transparent electrode layer.

It is still another further object of the present invention to provide a high aperture ratio and low contact resistance TFT structure which includes a polymeric passivation layer overlying the structure and a transparent electrode layer on top of the polymeric passivation layer for achieving high aperture ratio of the structure.

SUMMARY OF THE INVENTION

In accordance with the present invention, a method for fabricating a high aperture ratio and low contact resistance TFT structure and device formed by such method are disclosed.

In a preferred embodiment, a method for fabricating a high aperture ratio TFT structure can be carried out by the operating steps of first providing a glass substrate, then forming metal gate on the substrate, then depositing gate nitride, intrinsic amorphous silicon and n+ amorphous silicon layers sequentially on the substrate embedding the metal gate, then depositing a source/drain metal layer on the n+ amorphous silicon layer, then patterning and etching the source/drain metal layer to expose the n+ amorphous silicon layer in an opening for a back channel, then defining an amorphous silicon island by a dry etching method and over-etching the gate nitride layer by at least 20% of its original thickness, then etching the back channel to expose the intrinsic amorphous silicon layer, then depositing a passivation nitride layer on top of the TFT structure, etching away the passivation nitride layer in the back channel and in a contact opening to a substrate by a first etch recipe, etching away the intrinsic amorphous silicon layer in the back channel by a second etch recipe, then depositing an organic polymer layer on top of the TFT structure and forming a contact opening to the source/drain metal layer, and depositing a transparent electrode layer on top of the TFT structure and into the contact opening with the organic polymer layer insulating the transparent electrode from other conductive layers.

The method for fabricating a high aperture ratio TFT structure may further include the step of forming the metal gate from a material selected from the group consisting of Al, Cr, W, Mo, Ta and their alloys. The method may further include the step of forming the metal gate in a bi-layer structure, and the step of forming the source/drain metal layer sandwiched between two buffer metal layers. The two buffer metal layers may be selected from the group consisting of Cr, Mo and Ti. The method may further include the step of depositing the source/drain metal layer of aluminum or an aluminum alloy, or the step of defining the amorphous silicon island by a dry etching method utilizing an etchant mixture of $SF_6$, $Cl_2$ and $O_2$.

The dry etching method for defining the amorphous silicon island preferably over-etches the gate nitride layer by at least 50% of its original thickness. The method may further include the step of etching away the passivation nitride layer in the back channel and in a contact opening to the glass substrate by a first etch recipe that has an etch rate ratio of SiNx:a-Si of not less than 5, or the step of etching away the intrinsic amorphous silicon layer in the back channel by a second etch recipe that has an etch rate ratio of a-Si:SiNx of not less than 5. The transparent electrode layer may be formed of indium-tin-oxide.

In an alternate embodiment, a method for making a low contact resistance TFT structure may be carried out by the steps of first providing a substantially transparent glass substrate, then forming a metal gate on the substrate from a first metal layer, then depositing gate nitride, intrinsic amorphous silicon and n+ amorphous silicon layers sequentially on the substrate embedding the metal gate, then depositing a second metal layer on the n+ amorphous silicon layer for forming source/drain electrodes that have low contact resistance, then patterning and etching the second metal layer to expose the n+ amorphous silicon layer in an opening for a back channel, then defining an amorphous silicon island by a dry etching method and simultaneously pre-etching the gate nitride layer, then etching the back channel to expose the intrinsic amorphous silicon layer, depositing a passivation nitride layer on top of the TFT structure, etching away the passivation nitride layer and the intrinsic amorphous silicon layer in the back channel by a two-step dry etching process, then depositing a polymeric dielectric layer on top of the TFT structure and forming a contact opening to the source/drain metal layer, and then depositing a transparent electrode layer on top of the TFT structure and into the contact opening.

The method may further include the step of forming the metal gate from a material of Al, Cr, W, Mo, Ta or their alloys, the method may further include the step of forming the metal gate in a bi-layer structure. The method may further include the step of forming the second metal layer sandwiched between two buffer metal layers which may be selected from the group consisting of Cr, Mo and Ti. The method may further include the step of depositing the second metal layer of aluminum or of an aluminum alloy.

The method may also include the step of defining the amorphous silicon island by a dry etching method utilizing an etchant mixture of $SF_6$, $Cl_2$ and $O_2$. The dry etching method for defining the amorphous silicon island pre-etches the gate nitride layer by at least 20% of its original thickness. The method may further include the step of etching away the passivation nitride layer and the intrinsic amorphous silicon layer in the back channel opening by a first etch recipe which has an etch rate ratio of SiNx:a-Si of not less than 5, followed by a second etch recipe which has an etch rate ratio of a-Si:SiNx of not less than 5.

The present invention is further directed to a high aperture ratio and low contact resistance TFT structure which includes a glass substrate, a metal gate on the substrate, a gate nitride layer embedding the metal gate, an intrinsic amorphous layer overlying the gate nitride layer, a passivation nitride layer deposited in a contact opening formed in a n+ amorphous silicon layer and a source/drain metal layer while on top of and in contact with the intrinsic amorphous silicon layer, a polymeric passivation layer overlying the passivation nitride layer and filling the contact opening, and a transparent electrode layer on top of the TFT structure providing electrical communication with the source/drain metal layer and functions as a top electrode in contact with the gate nitride layer forming a capacitor with the metal gate as a lower electrode.

The device may further include a source/drain metal layer which intimately joins the n+ amorphous silicon layer for contributing to a low contact resistance for the TFT structure. The transparent electrode layer may be formed of indium-tin-oxide. The metal gate may be formed of a material selected from the group consisting of Al, Cr, W, Mo, Ta and their alloys. The capacitor may be formed by the transparent electrode layer, the gate nitride layer and the metal gate providing improved storage capacitance.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for fabricating a high aperture ratio and low contact resistance thin film transistor structure and structures formed by such method. The method incorporates numerous novel processing steps to enable the fabrication of a TFT having advantageous features. For instance, a source/drain metal layer is deposited directly onto a n+ amorphous silicon layer such that the low contact resistance characteristic of the TFT can be realized. A transparent electrode layer such as ITO is deposited on top of the TFT structure and is used as a top electrode in a capacitor formed to improve the aperture ratio of the structure. Furthermore, during a definition process for an amorphous silicon island, the same dry etching step pre-etches a gate nitride layer by at least 20% of its original thickness such that a shorter etch time is required for a subsequent window-opening etching process on the glass substrate. This eliminates the chances that the metal gate may be damaged by over-etching in the nitride etching step. The present invention further utilizes a novel organic polymer planarization layer deposited on top of the TFT structure which functions not only as a planarization layer but also as an insulating layer for the subsequently deposited transparent electrode of ITO.

The present invention novel method may be carried out in a 6-mask process for forming a TFT structure that has high aperture ratio, low contact resistance and a storage capacitor which has stable performance. The novel process can be carried out by the following key processing steps in forming the high aperture ratio, low contact resistance back channel etched TFT:

1. Gate bus line deposition and patterning.
2. Continuous deposition of gate nitride, I-a-Si and n+ a-Si layers.

3. Immediate sputtering of source/drain (S/D) metal thin film after n+ a-Si layer deposition and S/D metal bus line patterning.
4. TFT a-Si island patterning.
5. Back channel etching.
6. Organic polymer layer passivation and patterning.
7. Capacitor a-Si etch stop layer removal.
8. Transparent electrode layer sputtering and patterning.

Figure 3A:
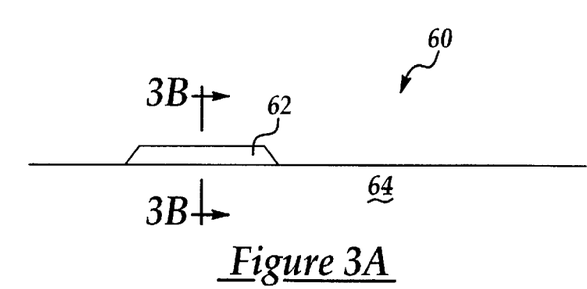
FIGS. 3A and 3B are enlarged, cross-sectional views of the present invention TFT with a metal gate deposited on a glass substrate shown in two perpendicular views.
Figure 3B:
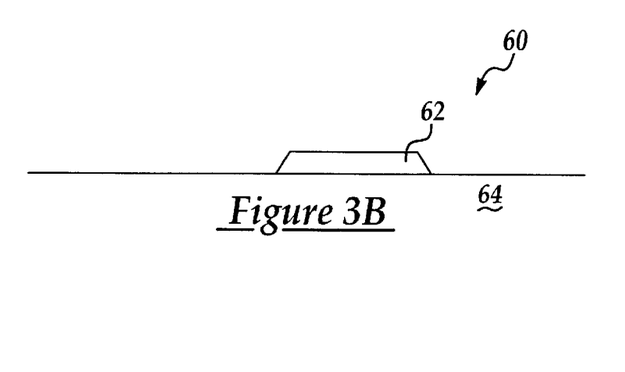
Figure 4A:
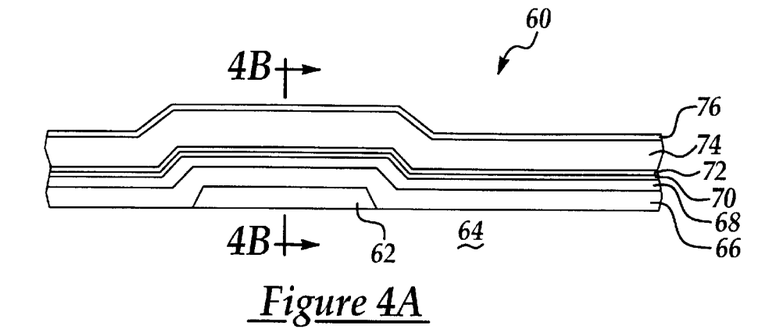
FIGS. 4A and 4B are enlarged, cross-sectional views of the present invention TFT of FIG. 3 having layers of gate nitride, intrinsic amorphous silicon, n+ amorphous silicon, bottom metal buffer layer, source/drain metal and top metal buffer layer deposited on the structure shown in two perpendicular views.
Figure 4B:
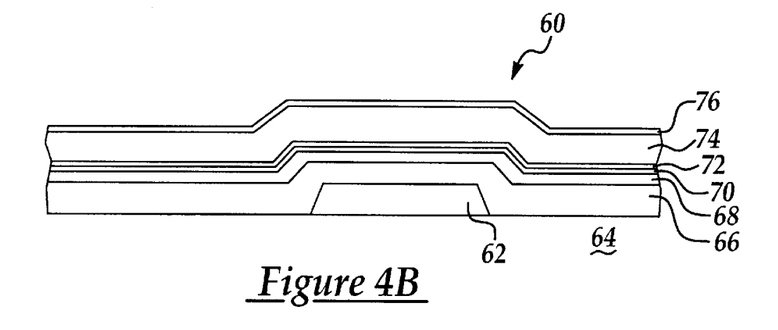

The detailed processing steps of the present invention novel method may be described as follows:

Referring now to FIGS. 3A and 3B, a present invention TFT structure 60 is shown in two perpendicular views. In the TFT structure 60, a metal gate layer 62 (or Metal 1, M1 layer) is first deposited and formed on a substantially transparent ceramic substrate 64. The substrate may be suitable a glass substrate. The gate metal is sputtered of a material such as Al, Cr, Mo/W, Mo or Ta. The gate metal layer 62 may further be provided with an oxidized metal surface layer such as $Al_2O_3$ or TaOx. The gate metal layer 62 may further be formed with aluminum alloys, or be formed in either a single layer or in a multi-layer. The metal gate layer 62 for a scan line is shown in FIGS. 3A and 3B. A first mask is used to pattern the metal gate 62.

On top of the metal gate 62, a plasma enhanced chemical vapor deposition (PECVD) technique is used to continuously deposit a silicon nitride layer 66, an intrinsic amorphous silicon layer 68 and a n+ doped amorphous silicon layer 70. The n+ doped amorphous silicon layer 70 may be deposited in the same chamber used for depositing the intrinsic amorphous silicon layer 68 by pumping in a doping gas during the CVD process. Without any patterning or forming process, a sputtering technique is used to deposit a source/drain metal layer 74 directly on top of the amorphous silicon layers 68, 70. Metal buffer layers 72, 76 may further be deposited to sandwich the source/drain metal layer 74 for improving its adhesion and electrical properties. The source/drain metal layer 74 may be deposited by sputtering a metal of aluminum or an aluminum alloy. While aluminum has superior electrical conductance, it has poor adhesion and causes hillock problems when deposited next to a material such as ITO (indium-tin-oxide) or an amorphous silicon. It is therefore desirable to sandwich the source/drain metal layer 74 inbetween two metal buffer layers which are also deposited by a sputtering process. The metal buffer layers may be suitably deposited of a material such as Cr, Mo, Ti or of any other suitable metal.

Figure 5A:
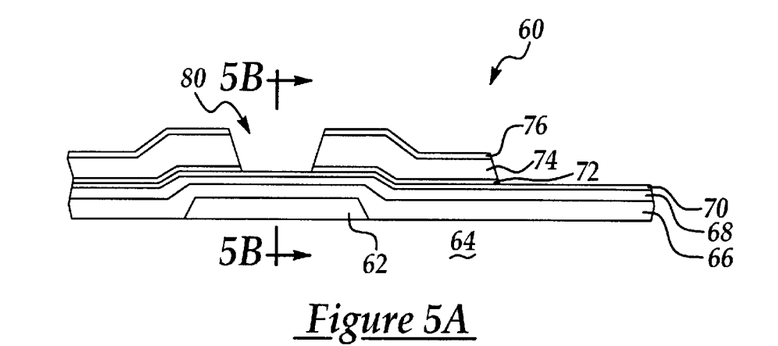
FIGS. 5A and 5B are enlarged, cross-sectional views of the present invention structure of FIG. 4 with a back channel opening formed exposing the n+ amorphous silicon layer on top of the metal gate in two perpendicular views.
Figure 5B:
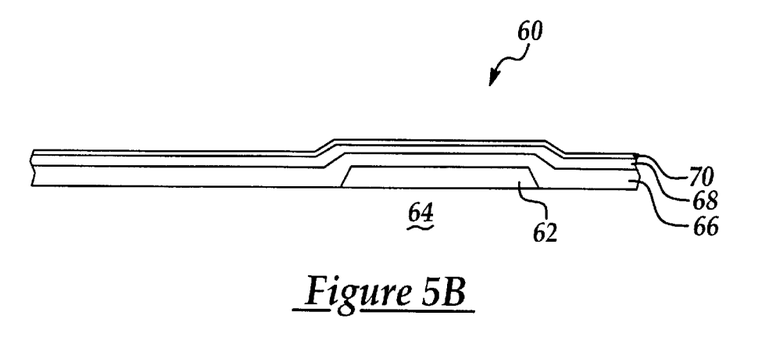

In the next step of the process, the Metal 2 (M2) layer or the source/drain metal layer 74 is patterned and formed by a second photomask. This is shown in FIGS. 5A and 5B. The forming process for a back channel 80 is conducted by either a dry etching process or a wet etching process. The wet etching process has the benefit of a shorter reaction time for completing the back channel 80. The second photomask utilized is not shown in FIGS. 5A and 5B. After the completion of the wet etching process for forming the back channel 80, the n+ amorphous silicon layer 70 is exposed in the back channel.

Figure 6A:
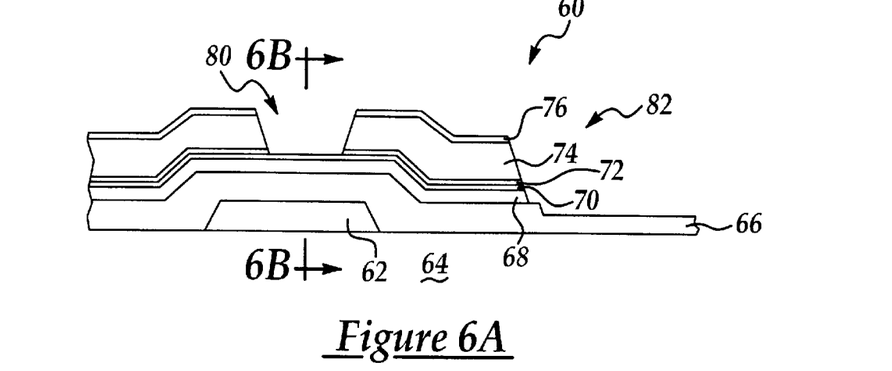
FIGS. 6A and 6B are enlarged, cross-sectional view of the present invention structure of FIG. 5 having an amorphous silicon island defined and the gate nitride layer pre-etched shown in two perpendicular views.
Figure 6B:
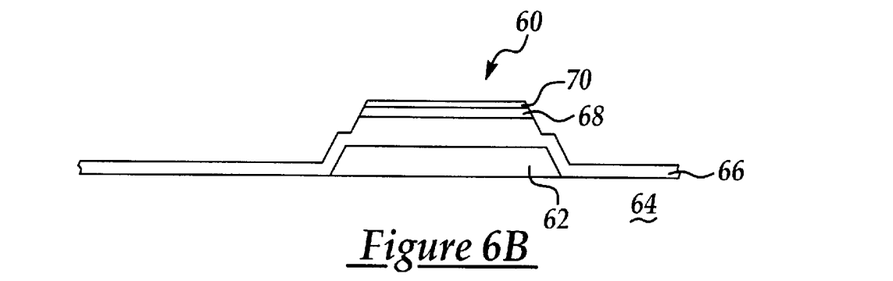

As shown in FIGS. 6A and 6B, an amorphous silicon island 82 is then formed by patterning with a third photomask (not shown) and etched. A dry etching process such as reactive ion etching utilizing an etchant gas mixture of $SF_6$, $Cl_2$ and $O_2$ may be suitably be used. The etchant mixture is effective in etching both the n+ amorphous silicon layer 70 and the gate nitride layer 66. The M2 layer 74 also acts as a photomask since it is not transparent during a photolithographic process. It should be noted that during this process, not only an amorphous silicon island 82 is formed by etching away the excess layers of the n+ amorphous silicon layer 70 and the intrinsic amorphous silicon layer 68, the dry etching process further over-etches (or pre-etches) the gate nitride layer 66 by at least 20% of its original thickness, and preferably by at least 50% of its original thickness. This is shown in FIGS. 6A and 6B. This over-etching (or pre-etching) process for the gate nitride layer 66 is important for the subsequent preparation of a contact window which opens to the glass substrate 64. This will be described in a later section.

Figure 7A:
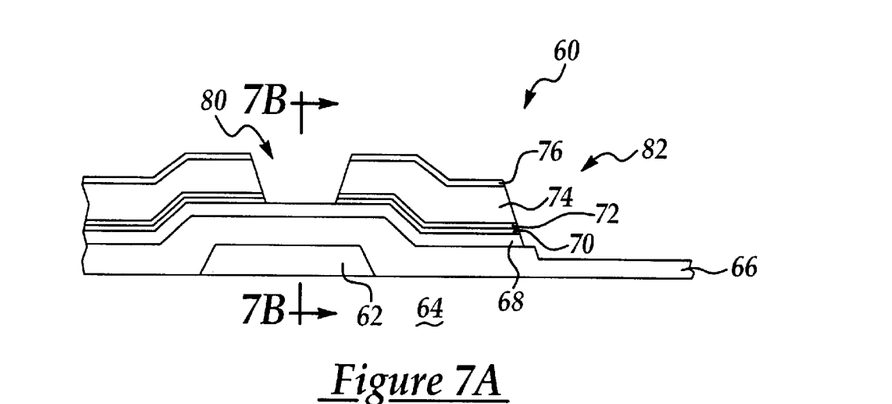
FIGS. 7A and 7B are enlarged, cross-sectional views of the present invention structure of FIG. 6 having the back channel formed by etching away the n+ amorphous silicon layer shown in two perpendicular views.
Figure 7B:
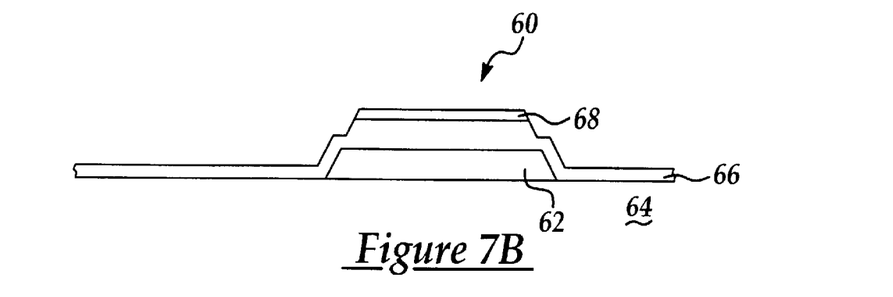
Figure 8A:
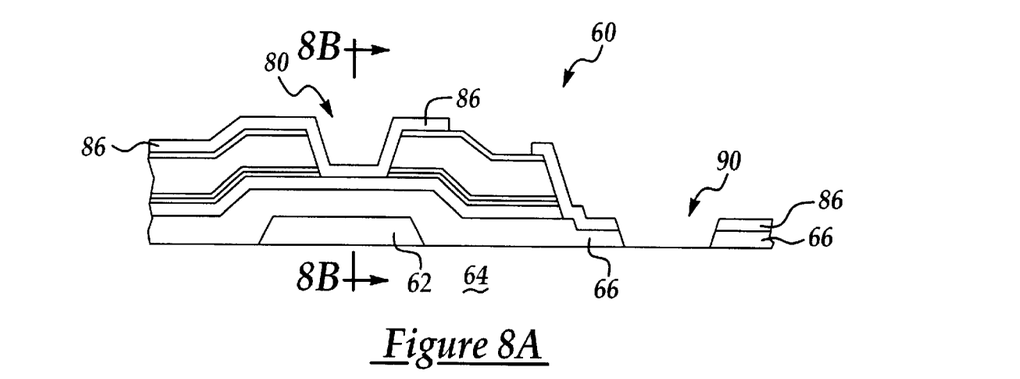
FIGS. 8A and 8B are enlarged, cross-sectional views of the present invention structure of FIG. 7 with a passivation nitride layer deposited and patterned by a first etch recipe shown in two perpendicular views.
Figure 8B:
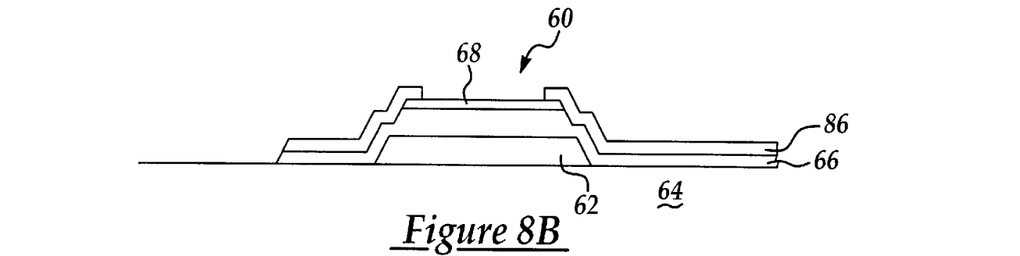

In the next processing step, as shown in FIGS. 7A and 7B, back channel etching is carried out by a dry etching method of RIE. The n+ amorphous silicon layer 70 shown in FIGS. 6A and 6B is removed. The formation process for the back channel 80 is therefore completed. In the next step of the process, as shown in FIGS. 8A and 8B, a passivation nitride layer 86 is deposited on top of the TFT structure 60 to fill in the back channel 80. The passivation nitride layer 86 is then patterned by a fourth photomask (not shown) and dry etched in a two-step etching process. In the two-step etching process, a first step is used to etched away the nitride layer, i.e., the passivation nitride layer 86 in the back channel 80, and the passivation nitride layer 86 together with the gate nitride layer 66 for forming a contact opening 90 on the glass substrate 64. As shown in the perpendicular view of FIGS. 8A and 8B, the intrinsic amorphous silicon layer 68 remains after the first step etching process which is carried out by using an etch chemistry that has an etched rate ratio of SiNx:a-Si>5. Based on the large etch rate ratio, the nitride layer 86 can be efficiently removed without over etching into the amorphous silicon layer 68.

Figure 9A:
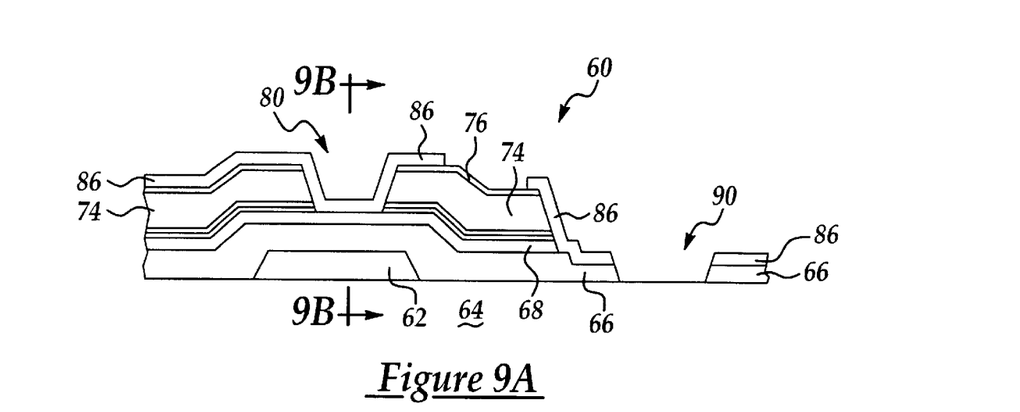
FIGS. 9A and 9B are enlarged, cross-sectional views of the present invention structure of FIG. 8 after patterned by a second etch recipe for etching away the intrinsic amorphous silicon layer shown in two perpendicular views.
Figure 9B:
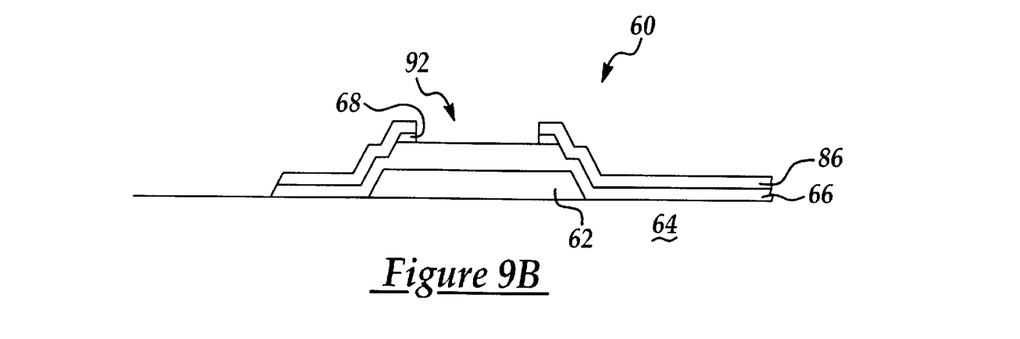

In the second etching step, by using a second etch recipe which has an etch rate ratio of a-Si:SiNx>5, the intrinsic amorphous silicon layer 68 is removed form the top of the gate nitride layer 66. This is shown in FIGS. 9A and 9B. A capacitor node 92 is thus formed with the metal gate 62 as the lower electrode and the gate nitride layer 66 as the dielectric layer. It should be noted that during the second etching step, wherein an isotropic etching of RIE process is used, a residual portion of the intrinsic amorphous silicon layer 68 remains under the passivation nitride layer 86 top of the capacitor node 92. It should also be emphasized that during the formation of contact opening 90 in the first etching step, the etching is easily carried out since the gate nitride layer 66 has already been pre-etched in the previous formation process for the amorphous silicon island (shown in FIGS. 6A and 6B).

Figure 10A:
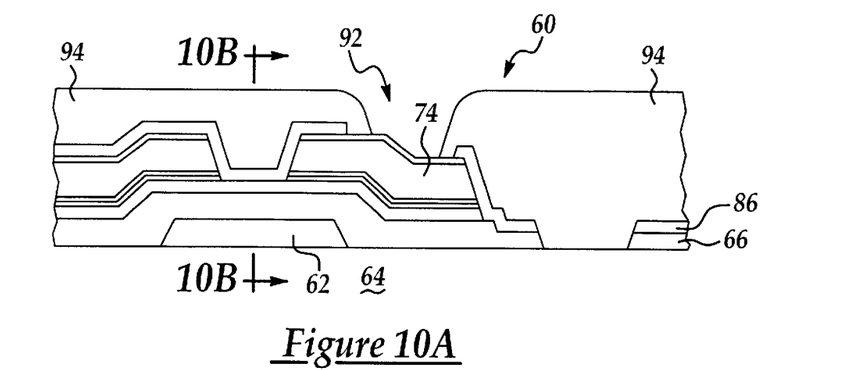
FIGS. 10A and 10B are enlarged, cross-sectional views of the present invention structure of FIG. 9 having a polymeric planarization layer deposited and patterned on top of the structure shown in two perpendicular views.
Figure 10B:
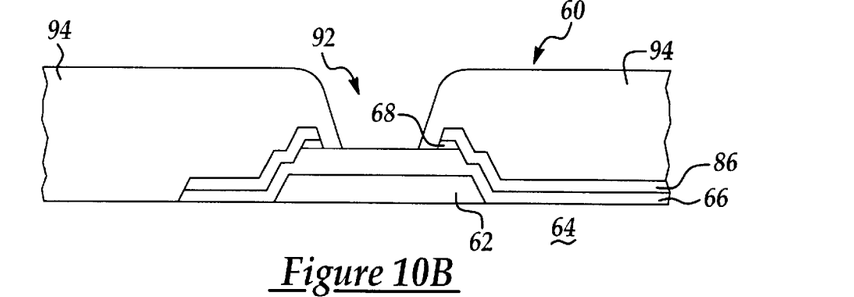

FIGS. 10A and 10B show the next step process wherein an organic polymer planarization layer 94 is blanketed deposited on top of the TFT structure 60. A suitable polymeric material is one such as PMMA and polyimide. It is more desirable to use a polymeric material that is photosensitive, i.e., is itself a photoresist material. The polymeric passivation layer 94 can be patterned by using a fifth photomask (not shown) when the polymer layer is not a photoresist. A contact window 96 for the source/drain metal layer 74 is formed for providing electrical communication with the source/drain metal 74. In the perpendicular view of FIGS. 10A and 10B, it is seen that the polymeric planarization layer 94 is deposited and formed to provide a capacitor node 92 and furthermore, to provide insulation between the residual intrinsic amorphous silicon layer 68 and a subsequently deposited ITO electrode (shown in FIGS. 11A and 11B).

Figure 11A:
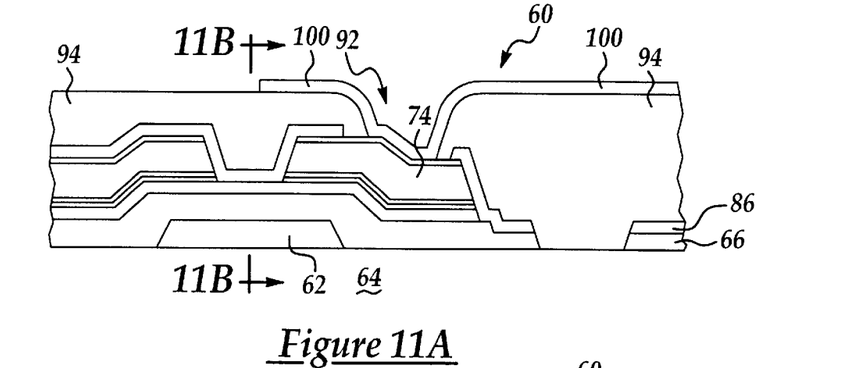
FIGS. 11A and 11B are enlarged, cross-sectional views of the present invention structure of FIG. 10 with a transparent electrode layer deposited and a capacitor formed shown in two perpendicular views.
Figure 11B:
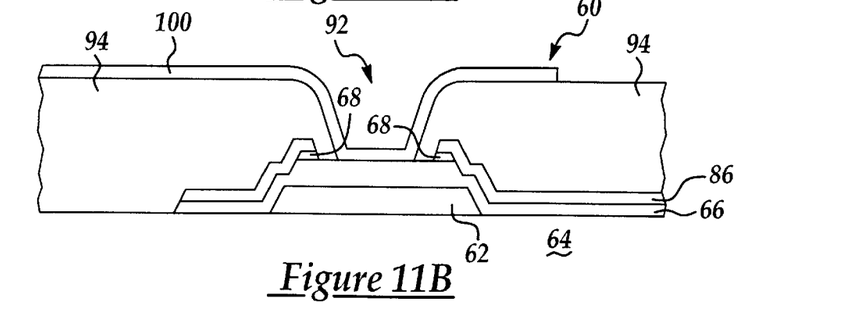

In a final step of the fabrication process for the present invention novel high aperture ratio, low contact resistance TFT structure, as shown in FIGS. 11A and 11B, a transparent electrode layer 100 is deposited on top of the TFT structure 60. The transparent electrode layer can be suitably deposited of a material such as indium-tin-oxide and forming a thin electrode in a subsequent photomasking process by using a sixth photomask (not shown). The ITO layer 100 provides a contact to source/drain metal 74 in the contact opening 96 such that electrical communication can be made to the source/drain metal layer 74. The ITO layer 100 further forms a top electrode in the capacitor 92 on top of the dielectric layer formed by the gate nitride layer 66. The ITO layer 100 deposited on top of the TFT structure 60 therefore enables the formation of the TFT as a high aperture ratio transistor.

The present invention novel method can be carried out either as a 6-mask process or as a 5-mask process when a photosensitive polymeric material is used for the passivation layer 94.

The present invention novel high aperture ratio and low contact resistance thin film transistor structure has therefore been amply demonstrated in the above descriptions and in the appended drawings of FIGS. 3A~11B. The novel TFT structure provides numerous benefits such as a low contact resistance existed between the source/drain metal layer deposited directly on the n+ amorphous silicon layer. This results in a 30%~50% reduction in the contact resistance. Secondly, a more stable storage capacitance is achieved in the capacitor formed by the ITO layer, since only nitride, and not amorphous silicon exists between the ITO layer and the metal gate. Thirdly, the large coverage on the structure by the transparent electrode layer results in a high aperture ratio TFT.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for fabricating a high aperture ratio thin film transistor (TFT) structure comprising the steps of:
   providing a glass substrate,
   forming a metal gate on said substrate,
   depositing gate nitride, intrinsic amorphous silicon and n+ amorphous silicon layers sequentially on said substrate embedding said metal gate,
   depositing a metal layer on said n+ amorphous silicon layer,
   patterning and etching said metal layer to expose said n+ amorphous silicon layer in an opening for a back channel,
   defining an amorphous silicon island by a dry etching method and over-etching said gate nitride layer by at least 20% of its original thickness,
   etching said n+ amorphous silicon layer on said back channel to expose the intrinsic amorphous silicon layer,
   depositing a passivation nitride layer on top of said TFT structure,
   etching away a portion of said passivation nitride layer in said back channel, and said passivation nitride and gate nitride layers in a first contact opening for said substrate by a first etch recipe,
   etching away a portion of said intrinsic amorphous silicon layer in said back channel not covered by said passivation nitride layer by a second etch recipe,
   depositing an organic polymer layer on top of the TFT structure and forming a second contact opening to said metal layer, and
   depositing a transparent electrode layer on top of the TFT structure and into said second contact opening with said organic polymer layer insulating said transparent electrode from other layers.

2. A method for fabricating a high aperture ratio thin film transistor structure according to claim 1 wherein said metal gate is selected from the group consisting of Al, Cr, W, Mo, Ta and their alloys.

3. A method for fabricating a high aperture ratio thin film transistor structure according to claim 1 wherein said metal gate comprises a bi-layer structure.

4. A method for fabricating a high aperture ratio thin film transistor structure according to claim 1 further comprising the step of forming said metal layer sandwiched between two buffer metal layers.

5. A method for fabricating a high aperture ratio thin film transistor structure according to claim 4, wherein said two buffer metal layers are selected from the group consisting of Cr, Mo and Ti.

6. A method for fabricating a high aperture ratio thin film transistor structure according to claim 1 wherein said metal layer is selected from the group consisting of aluminum and aluminum alloy.

7. A method for fabricating a high aperture ratio thin film transistor structure according to claim 1 wherein said dry etching method for defining said amorphous silicon island comprises an etchant mixture of $SF_6$, $Cl_2$ and $O_2$.

8. A method for fabricating a high aperture ratio thin film transistor structure according to claim 1, wherein said dry etching method for defining said amorphous silicon island preferably over-etches said gate nitride layer by at least 50% of its original thickness.

9. A method for fabricating a high aperture ratio thin film transistor structure according to claim 1 wherein said first etch recipe comprises an etch rate ratio of SiNx:a-Si of not less than 5.

10. A method for fabricating a high aperture ratio thin film transistor structure according to claim 1 wherein said second etch recipe comprises an etch rate ratio of a-Si:SiNx of not less than 5.

11. A method for fabricating a high aperture ratio thin film transistor structure according to claim 1, wherein said transparent electrode layer being formed of indium-tin-oxide (ITO).

12. A method for making a low contact resistance TFT structure comprising the steps of:
   providing a substantially transparent ceramic substrate,
   forming a metal gate on said substrate from a first metal layer,
   depositing gate nitride, intrinsic amorphous silicon and n+ amorphous silicon layers sequentially on said substrate embedding said metal gate,
   depositing a second metal layer on said n+ amorphous silicon layer for forming source/drain electrodes,
   patterning and etching said second metal layer to expose said n+ amorphous silicon layer in an opening for a back channel,
   defining an amorphous silicon island by a dry etching method and simultaneously pre-etching said gate nitride layer,
   etching said back channel to expose the intrinsic amorphous silicon layer,
   depositing a passivation nitride layer on top of said TFT structure, etching away a portion of said passivation nitride layer and a portion of said intrinsic amorphous silicon layer in said back channel by a two-step dry etching process, etching away said passivation nitride and gate nitride layers in a first contact opening for said substrate, depositing a polymeric dielectric layer on top of said TFT structure and forming a second contact opening to said second metal layer, and depositing a transparent electrode layer on top of TFT structure and into said second contact opening.

13. A method for fabricating a high aperture ratio thin film transistor structure according to claim 12 wherein said metal gate is selected from the group consisting of Al, Cr, W, Mo, Ta and their alloys.

14. A method for fabricating a high aperture ratio thin film transistor structure according to claim 12 wherein said metal gate comprises a bi-layer structure.

15. A method for fabricating a high aperture ratio thin film transistor structure according to claim 12 further comprising the step of forming said second metal layer sandwiched between two buffer metal layers, said two buffer metal layers being selected from the group consisting of Cr, Mo and Ti.

16. A method for fabricating a high aperture ratio thin film transistor structure according to claim 12 wherein said second metal layer is selected from the group consisting of aluminum and aluminum alloy.

17. A method for fabricating a high aperture ratio thin film transistor structure according to claim 12 wherein said dry etching method for defining said amorphous silicon island comprises an etchant mixture of $SF_6$, $Cl_2$ and $O_2$.

18. A method for fabricating a high aperture ratio thin film transistor structure according to claim 12, wherein said dry etching step for defining said amorphous silicon island pre-etches said gate nitride layer by at least 20% of its original thickness.

19. A method for fabricating a high aperture ratio thin film transistor structure according to claim 12 wherein the step of etching away said passivation nitride layer and said intrinsic amorphous silicon layer in said back channel comprising first etch recipe having an etch rate ratio of SNx:a-Si of not less than 5, followed by a second etch recipe having an etch rate ratio of a-Si:SiNx of not less than 5.

* * * * *